(12) United States Patent
Zandbergen

(10) Patent No.: US 7,238,953 B2
(45) Date of Patent: Jul. 3, 2007

(54) SPECIMEN HOLDER FOR AN ELECTRON MICROSCOPE AND METHOD FOR REDUCING THERMAL DRIFT IN A MICROSCOPE

(75) Inventor: Hendrik Willem Zandbergen, Katwijk ZH (NL)

(73) Assignee: Technische Universiteit Delft, Delft (NL)

( * ) Notice: Subject to any disclaimer, the term of this patent is extended or adjusted under 35 U.S.C. 154(b) by 149 days.

(21) Appl. No.: 10/519,293

(22) PCT Filed: Jun. 24, 2003

(86) PCT No.: PCT/NL03/00467

§ 371 (c)(1),
(2), (4) Date: Aug. 22, 2005

(87) PCT Pub. No.: WO2004/023514

PCT Pub. Date: Mar. 18, 2004

(65) Prior Publication Data
US 2006/0097187 A1 May 11, 2006

(30) Foreign Application Priority Data
Jun. 25, 2002 (NL) .................................. 1020936

(51) Int. Cl.
H01J 37/20 (2006.01)

(52) U.S. Cl. .............................. 250/440.11; 250/443.1; 250/311; 250/442.11

(58) Field of Classification Search ............. 250/443.1, 250/440.11, 442.11, 311
See application file for complete search history.

(56) References Cited

U.S. PATENT DOCUMENTS

| 4,427,891 | A | * | 1/1984 | Georges et al. | .......... 250/443.1 |
| 4,950,901 | A | * | 8/1990 | Jones et al. | ............... 250/443.1 |
| 5,753,924 | A | * | 5/1998 | Swann | ..................... 250/443.1 |
| 5,986,270 | A | * | 11/1999 | Bormans et al. | ....... 250/442.11 |
| 6,410,925 | B1 | * | 6/2002 | Armbruster et al. | ... 250/442.11 |

FOREIGN PATENT DOCUMENTS

| DE | 2 126 623 | 12/1972 |
| EP | 0 538 861 | 4/1993 |
| JP | 62172246 | 7/1987 |

* cited by examiner

Primary Examiner—Nikita Wells
Assistant Examiner—Johnnie L Smith, II
(74) Attorney, Agent, or Firm—Michaelson & Associates; Peter L. Michaelson

(57) ABSTRACT

A specimen holder for an electron microscope, comprising a rod-shaped part, which is provided near one end with a tip, which tip is arranged to receive a specimen, the rod-shaped part, in use, extending with at least the tip into the electron microscope, held by clamping means present in the electron microscope, wherein first temperature control means are provided to control the temperature of the rod-shaped part and/or the clamping means, such that this rod-shaped pan and the clamping means substantially have the same temperature, at least at the location of their contact surfaces.

16 Claims, 4 Drawing Sheets

SPECIMEN HOLDER FOR AN ELECTRON MICROSCOPE AND METHOD FOR REDUCING THERMAL DRIFT IN A MICROSCOPE

The invention relates to a specimen holder for an electron microscope.

With such a holder, a specimen to be examined can be held in a microscope under desired conditions. To this end, the known specimen holder comprises a rod-shaped, usually hollow part, which is provided near one end with a substantially flat tip. The tip is arranged to receive the specimen. In use, the rod-shaped part is fixed in the microscope, in suitably provided clamping means. The rod-shaped part may include adjusting means, for instance, to tilt or otherwise maneuver the tip, at least a part thereof supporting a specimen. Also, the hollow rod-shaped part way include means to condition the specimen, for instance, to generate an electric field around the specimen or to bring the specimen to and keep it at a desired temperature.

For the accuracy of the measurement, it is highly important that during the examination the specimen retains its adjusted position. In practice, however, the specimen is found to be displaced. This so-called drift is caused, on the one hand, by mechanical vibrations and, on the other hand, by thermal expansion or shrinkage of parts of the specimen holder, as a result of temperature fluctuations occurring therein during use.

This can be seen from FIG. 6, which shows, in cross-sectional side view, a specimen holder provided with a hollow rod-shaped part 2 and a tip 3. The rod-shaped part is held in two places in clamping means 5, which are diagrammatically shown in FIG. 1 as two times three contact points 5A,B. In use, there is a temperature difference between the tip 3 and the rod-shaped part 2, certainly when the tip 3 is cooled or heated. As a result, heat transfer, indicated by arrows $H_1$, will take place between the tip 3 and the rod-shaped part 2. The rod-shaped part 2 will thus obtain a temperature $T_{rod}$ differing from that of the environment, in particular the temperature $T_{clamping}$ of the clamping means 5, so that also between these parts 2, 5, heat transfer will take place, indicated by arrows $H_2$. As long as the heat transfers $H_1, H_2$ are constant, a thermally stable situation prevails in the specimen holder, without drift.

In practice, however, these heat transfers $H_{1,2}$ do not remain constant, despite the fact that with the current specimen holders and electron microscopes, the temperatures of the tip and the clamping means can be kept reasonably constant, The heat transfer $H_2$ is actually dependent on the mechanical contact between the specimen holder 1 and the clamping means 5. When this contact changes, for instance, through a displacement of the specimen holder 1, this affects the transfer $H_2$. The temperature $T_{rod}$ of the rod-shaped part 2 will thus change, which is accompanied by shrinkage or expansion. Moreover, the temperature change of the rod-shaped part will also cause a change in the heat transfer $H_1$ to the tip 3, which has the result that also in the tip temperature variations will occur. This leads to a thermally unstable situation, which is accompanied by drift of the specimen.

The object of the invention is to provide a specimen holder of the type described before, in which the above thermal drift is reduced.

To this end, a specimen holder according to the invention is characterized by the features of claim 1.

By providing the specimen holder with first temperature control means, with which the temperature of the rod-shaped part can be kept at the same temperature as the temperature of the clamping means, at least at the location of the surface of contract with these clamping means, it is ensured that between the two parts no heat transfer will take place, even not when the holder, during use, is displaced relative to the clamping means. The temperature of the rod-shaped thus remains stable, so that this part will not expand or shrink. Thermal drift is thus effectively limited.

Depending on the need, the first temperature control means may comprise a cooling element, a heating element or both. When, for instance, the specimen holder is provided with second temperature control means to cool the tip of the holder during use, the first temperature control means preferably comprise a heating element. This enables compensation of a temperature fail of the rod-shaped part caused by the tip cooling, so that the eventual temperature of this part remains constant. Conversely, the first temperature control means preferably comprise a cooling element when the specimen holder is equipped with second temperature control means for heating the tip.

Of course, the first temperature control means may also comprise a cooling element and a heating element, which can be activated alternately. Also, the first temperature control means may be arranged such that, besides or instead of the temperature of the rod-shaped part, they control the temperature of the clamping means.

The cooling and heating elements may, for instance, be designed as a cooling and heating wire, respectively, which is provided around at least a part of the rod-shaped part, preferably near the tip. This enables a heat or cold stream passed via the tip to the rod-shaped part to be compensated directly at the source, so that this stream does not get the chance of effecting temperature changes elsewhere in the rod-shaped part.

In a further advantageous elaboration, a specimen holder according to the invention is characterized by the features of claim 7.

By providing between the tip and the outer surface of the rod-shaped part a thermally insulating connecting element, the heat or cold stream from the tip to the rod-shaped part can be reduced, so that less needs to be compensated by the first temperature control means. The connecting element is preferably manufactured from a relatively stiff material, so that sufficiently stiff support can be given to the tip so as to prevent vibrations. To increase the thermally insulating effect of the connecting element, this element may be provided with opening. These openings reduce the conduction surface and lengthen the conduction path, which considerably reduces the heat or cold conduction of the element. Moreover, the openings may be dimensioned and positioned such that the element retains sufficient stiffness.

In a very advantageous embodiment, a specimen holder according to the invention is characterized by the features of claim 12.

By building up the tip from different parts having different expansion coefficients, it can be ensured, through a proper mutual dimensioning and positioning of these parts, that stage or expansion of these individual parts outweigh each other, so that the eventual net displacement of the specimen is small and preferably approximately equal to zero.

A specimen holder according to the invention thus comprises an additional facility to minimize drift, in case, despite the first temperature control means, temperature changes, after all, occur in the tip of the specimen holder.

The invention father relates to an assembly of an electron microscope and a specimen holder characterized by the features of claim 15.

By providing the electron microscope with third temperature control means, the temperature of the clamping means can be adjusted to a constant, predetermined value. This temperature can then also be adjusted with the first temperature control means, preferably already previous to the arrangement of the specimen holder in the microscope. Because of this, almost directly after the arrangement of the specimen holder in the microscope, a thermally stable situation will occur, which prevents long waiting times. Moreover, when the clamping means and the rod-shaped part are both provided with individual temperature control means, a very accurate temperature control can be realized for both parts.

Of course, through a suitable design of the temperature control means, it may also suffice to use only the first or the third temperature control means to keep the temperature of the rod-shaped part and the clamping means at a desired value.

The invention further relates to a method for reducing thermal drift in an electron microscope characterized by the measures of claim 16.

By making the temperature of the specimen holder equal to the temperature of the environment with which this specimen holder is in contact during use, in particular the clamping means, heat transfer between the holder and the environment is prevented. This creates a thermally stable situation in the specimen holder, which is accompanied by minimal thermal drift.

The further subclaims describe more detailed advantageous embodiments of a specimen holder, assembly and method according to the invention.

To explain the invention, an exemplary embodiment of a specimen holder according to the invention will be described with reference to the drawing, in which.

Figure 5:
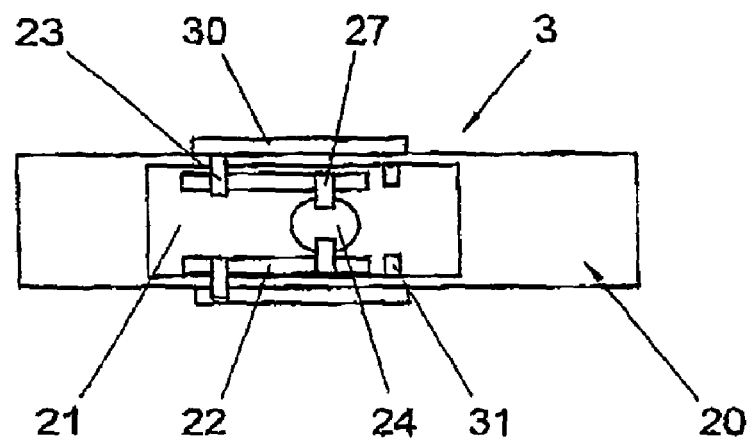
Figure 6:
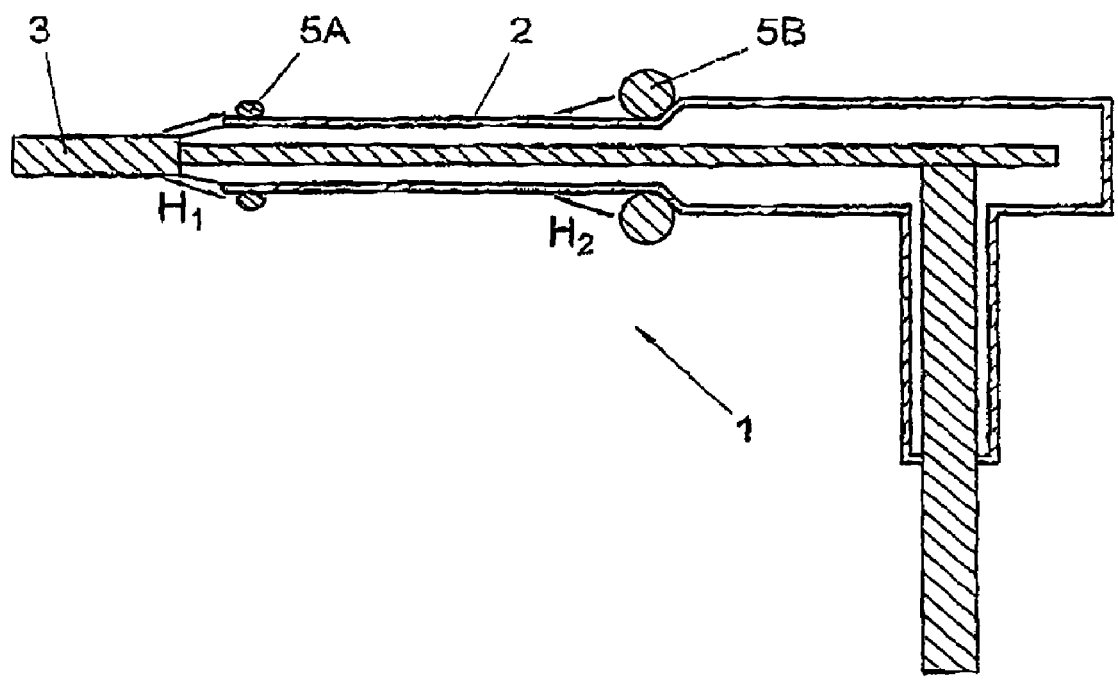

FIG. 5 diagrammatically shows a tip according to the invention, in top view;

FIG. 6 shows, in cross-sectional side view, a specimen holder according to the state of the art, in which the heat transfer between the different parts of the specimen holder and the environment is indicated.

Figure 1:
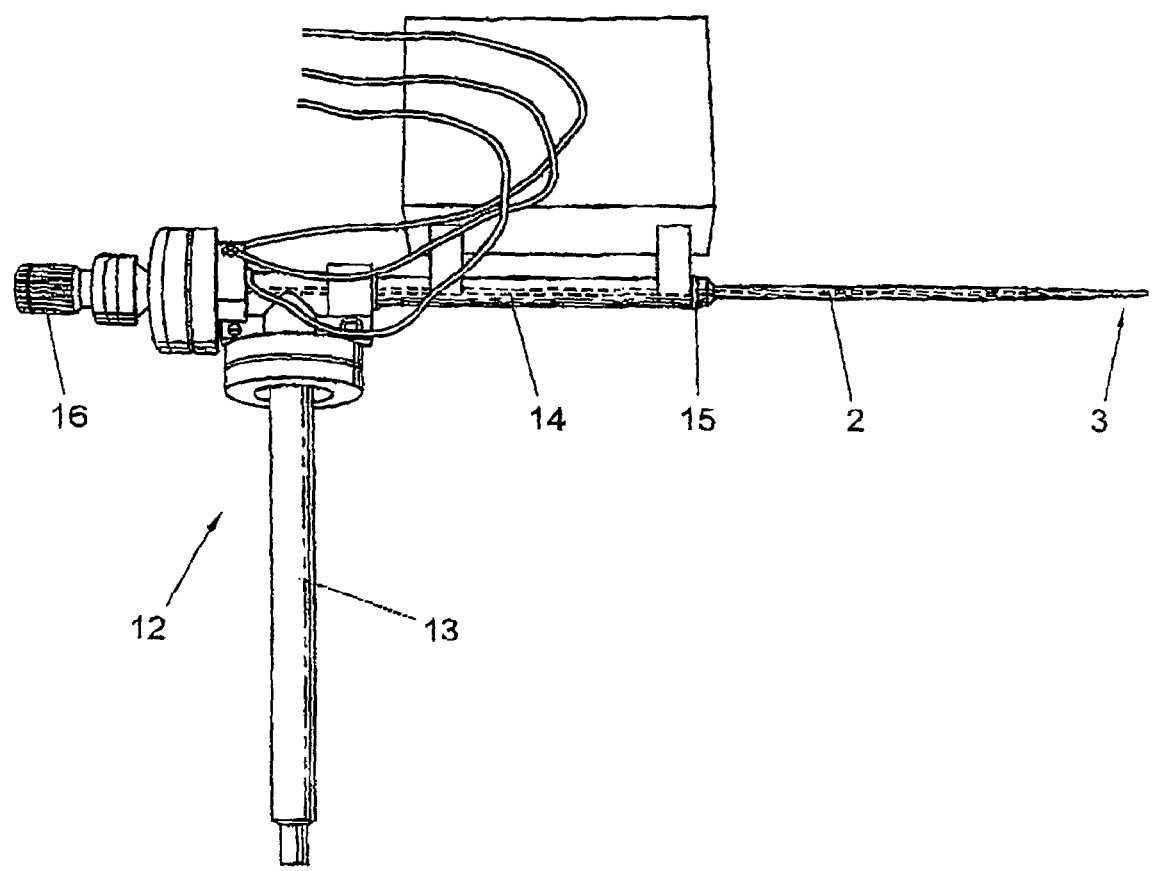
FIG. 1 shows, in side view, a specimen holder according to the invention.

FIG. 1 shows, in side view, a specimen holder 1 according to the invention, intended for holding a specimen to be examined stably in position in an electron microscope, in a desired position and under desired conditions.

The specimen holder comprises a stand 12 formed from a first tube section 13 and a second tube section 14, substantially extending at right angles to the first tube section 13. At a first end, the second tube section 14 transitions into a hollow rod-shaped part 2 having a slightly smaller diameter. Near a free end, the rod-shaped part 2 is provided with a tip 3 arranged to receive the specimen to be examined. The tip 3 will be described in more detail with reference to FIGS. 2 and 4.

The second tube section 14 is provided near the transition into the rod-shaped part 2 with a sealing ring 15 and, furthermore, near an end distal from the rod-shaped part 2 with operating means 16. The operating means 16 are connected with electric and/or mechanical transmission means and/or second temperature control means, which extend through the second tube section 14 and the hollow rod-shaped part 2 to the tip 3, and with which, for instance, the position of the tip 3 or the temperature can be controlled.

In use, the specimen holder 1, after a specimen has been placed thereon, can be passed through an opening in the electron microscope, the rod-shaped part 2 with the tip 3 extending into the microscope, and the stand 12 with the operating means 16 being arranged outside the microscope. The sealing ring 15 provides an airtight seal of the opening in the electron microscope, The rod-shaped part 2, which, in use, extends into the microscope, is supported near its ends by clamping means 5, as diagrammatically shown in FIG. 6. Such a support is desirable from a mechanical viewpoint, because with it vibrations of the tip 3 can be suppressed, at least reduced. From a thermal viewpoint, however, the support is disadvantageous, because the contact spice between the rod-shaped part 2 and the clamping means 5 forms a bridge via which heat can flow into or out of the specimen holder 1. This leads to a thermally unstable situation in which the temperature of the specimen holder 1 can constantly change. Such temperature changes lead to shrinkage or expansion of the specimen holder 1 and hence to thermal drift of the specimen.

In a specimen holder 1 according to the invention, heat transfer via the above contact surfaces is prevented by keeping at least these contact surfaces at the same temperature. In the absence of a temperature deference, no heat transfer will take place. Preferably, the entire outer surface of the specimen holder 1 between the above contact surfaces is kept at the same temperature as the clamping means 5, so that the specimen holder 1 can be displaced relative to the specimen holder 1 without leading to temperature differences.

Figure 2:
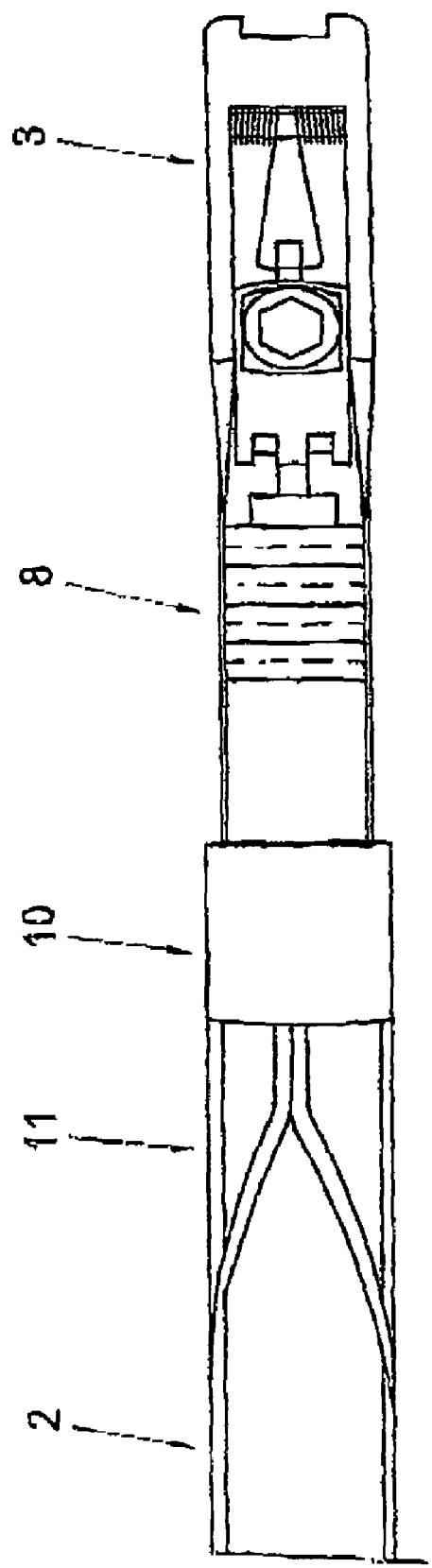
FIG. 2 shows an enlargement of an end of the specimen holder of FIG. 1, provided with tip, connecting element and first temperature control means.

To adjust the above temperature, the specimen holder 1 is provided with first temperature control means 10, as shown in FIG. 2. The first temperature control means 10 comprise a cooling and/or heating element, with which the outer surface of the rod-shaped part 2, depending on the need, can be cooled or heated, respectively. If the specimen holder of FIG. 2 comprises, for instance, second temperature control means (not shown), with which the tip 3 can be cooled during use, then, in use, a cold stream from the tip 3 to the rod-shaped part 2 will occur. In the absence of the first temperature control means 10, this cold stream will lead to a temperature fall of the rod-shaped part 2. To prevent this fall, the first temperature control means 10 must, in that case, comprise a heating element. This heating element may, for instance, be designed as a heating wire 18, as shown in FIG. 2, which is wound around the rod-shaped part 2, preferably near the cold source to be compensated, here the tip 3. In a similar manner, when, in use, the tip 3 is heated, a cooling element may be provided around the rod-shaped part 2. It is noted that the first temperature control means 10 may also be used with specimen holders 1, the tip 3 of which, in use, is not cooled or heated In such specimen holders 1, too, temperature changes may occur during use, or instance when arranging a new specimen holder 1, not yet acclimatized, in the clamping means 5 or as a result of a displacement of the specimen holder 1 in the clamping means 5, as a result of which the heat transfer between the two changes.

Besides the cooling and/or heating element, the first temperature control means 10 may further comprise a temperature sensor, for instance a thermocouple 11, as shown in FIG. 2. With it, the temperature of the rod-shaped part 2 can be checked, and measures can be taken as soon as this temperature deviates from the desired value.

Figure 3:
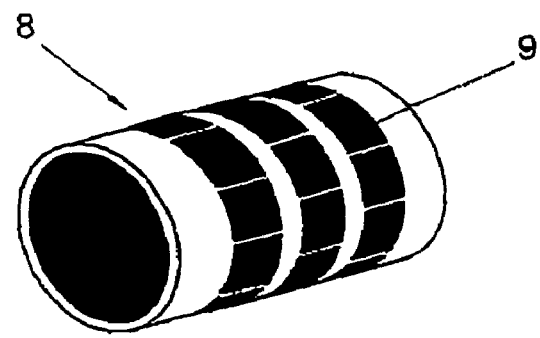
FIG. 3 shows, in perspective view, an embodiment of a thermally insulating connecting element according to the invention.

To minimize the required compensation by the first temperature control means 10, the heat transfer between the tip 3 and the rod-shaped part 2 is preferably minimized. Ideally, therefore, a vacuum would be applied between the tip and the rod-shaped part 2. This offers the best thermal insulation. However, a vacuum offers the tip 3 insufficient support to protect it from vibrations. A similar problem occurs with known materials having a high thermally insulating effect, such as plastic, in particular polystyrene foam. Such materials are usually insufficiently stiff to support the tip 3 adequately from a mechanical viewpoint. On the other hand, sufficiently stiff materials often have a relatively poor insulating effect. In a specimen holder 1 according to the invention, this problem is solved by arranging an insulator between the tip 3 and the rod-shaped part 2, as shown in FIGS. 3 and 4.

The insulator comprises a substantially tubular connecting element 8, which extends between the tip 3 and an outer surface of the rod-shaped part 2. The tubular connecting element 8 is manufactured from a relatively stiff material having a relatively low heat conduction coefficient, for instance titanium. The element 8 is provided with openings 9. Openings 9 are understood herein to mean at least openings, slots, gaps and the like, continuous or not continuous. Because of these openings 9, the surge through which heat conduction can take place is reduced. Moreover, a proper design and placement of the openings 9 can considerably lengthen the conduction path. This appears from the embodiment shown in FIG. 4, in which the openings 9, seen in the circumferential direction, have a relatively narrow, elongated shape and are staggered relative to each other. As a result, the conduction path zigzags between the openings, as indicated by the arrow W. The heat conductivity of the connecting element 8 can thus be reduced considerably, so that a good thermally insulating effect is obtained, while, besides, the element 8 is sufficiently stiff to support the tip 3 against vibrations.

Figure 4:
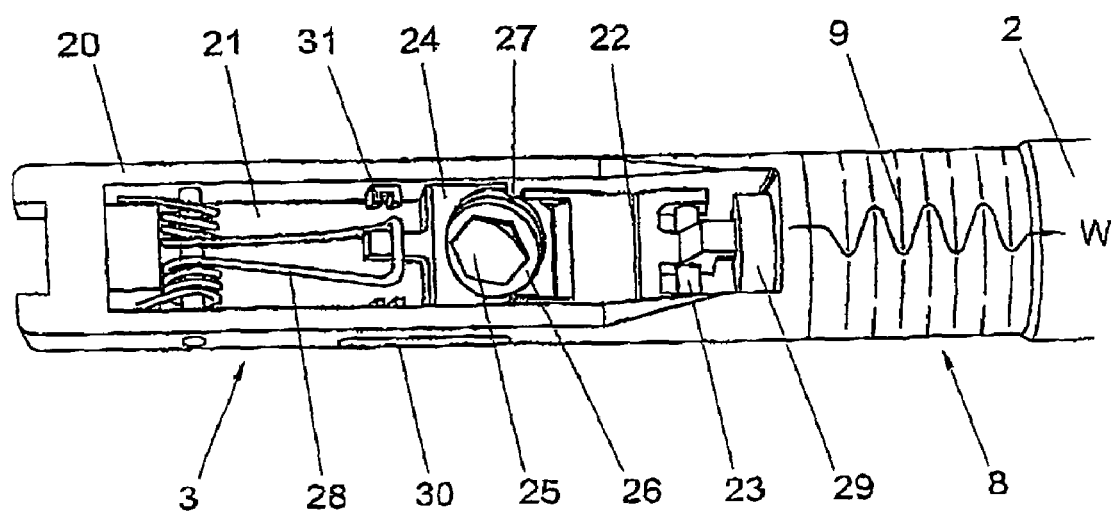
FIG. 4 shows an enlargement of a tip and a thermally insulating connecting element, in top view.

FIG. 4 further shows an enlargement of a tip 3 according to the invention, while the tip 3 is diagrammatically shown in FIG. 5. A tip 3 according to the invention comprises a substantially rectangular frame 20 provided with a substantially rectangular opening 21. In the opening 21, a substantially rectangular subframe 22 extends, which is pivot-mounted to the frame 20 with a short side facing the rod-shaped part 2. The pivot 23 extends in the plane of the frame 20, substantially parallel to the above short side.

The tip 3 farther comprises a substantially square platform 24, provided with an opening 25 surrounded by a recessed edge 26, which can serve as a supporting surface for a specimen. The platform 24 is pivot-mounted to a free side of the subframe 22 remote from the pivot 23. The pivot 27 of the platform 24 extends substantially parallel to the pivot 23 of the subframe 22. With a free end located opposite the pivot 27, the platform 24 is connected with a spring 28, which spring 28, with another end, is connected with the frame 20.

From the rod-shaped part 2, an operating rod 29 extends to the subframe 22. In use, this enables the subframe 22 and the platform 24 to be tilted around their respective pivots 23, 27, the spring 28 admitting tilting of the platform 24, but increasing the stiffness.

The tip 3 of the specimen holder is preferably manufactured from a relatively good heat conductive material in relation to the environment, which material shows a limited thermal expansion, for instance tungsten. Provided against the outside of the tip 3, beside the opening 21, are two strips 30, on the one hand connected with the pivot 23, and on the other hand via screws 31 to the wall 32 of the tip 3. The screws 31 extend through the wall 32. The strips are preferably manufactured from aluminum, at least a material having a thermal expansion coefficient deviating from that of the material of the tip 3 and/or the platform 24 and/or the pivot 23. Expansion is thus readily compensated, and mounting of the tip is readily possible.

A specimen holder as described before therefore comprises provisions at a number of levels, which minimizes thermal drift, while, moreover, the specimen can be supported mechanically in a sufficiently stiff manner to also minimize drift caused by vibrations.

Thus, the specimen holder comprises first temperature control means with which heat transfer between the specimen holder and the supporting environment is prevented, so that the specimen holder can be supported adequately without leading to an unstable temperature in the specimen holder.

Furthermore, between the rod-shaped part and the tip is provided an insulating connecting element which combines great stiffness with a low heat conductivity. This enables limitation of heat transfer between the tip and the rod-shaped part and accompanying temperature changes.

Besides, the tip of the specimen holder is arranged such that, should temperature changes occur therein after all, the different parts of the tip will expand or shrink in opposite directions and will outweigh each other, so that the eventual displacement of the specimen is zero.

The invention claimed is:

1. A specimen holder for an electron microscope, comprising a rod-shaped part (2), which is provided near one end with a tip (3), which tip (3) is arranged to receive a specimen, the rod-shaped part (2), in use, extending with at least the tip (3) into the electron microscope, held by clamping means (5) present in the electron microscope, wherein first temperature control means (10) are provided to control the temperature of the rod-shaped part (2) and/or the clamping means (5), such that this rod-shaped part (2) and the clamping means (5) substantially have the same temperature, at least at the location of their contact surfaces.

2. A specimen holder according to claim 1, wherein the first temperature control means (10) comprise a cooling element and/or a heating element.

3. A specimen holder according to claim 1, wherein second temperature control means are provided to control the temperature of the tip (3), at least a part of the tip (3) arranged to receive the specimen, the second temperature control means comprising cooling means and/or heating means.

4. A specimen holder according to claim 1, wherein the first temperature control means (10) are provided around at least a part of the rod-shaped part (2).

5. A specimen holder according to claim 4, wherein at least a part of the first temperature control means (10) is arranged near the tip (3) of the specimen holder (1).

6. A specimen holder according to claim 1, wherein the rod-shaped part (2), in use, is held in at least two spaced apart positions by the clamping means (5), the first temperature control means (10) being arranged to keep the rod-shaped part (2), at least the outer surface thereof, between the holding positions at the same temperature as the temperature of the clamping means (5).

7. A specimen holder, in particular according to claim 1, wherein between the tip (3) and the outer surface of the rod-shaped part (2) a substantially shell-shaped connecting element (8) is provided, manufactured from a relatively stiff, impact resistant, thermally insulating material, openings (9) being provided in the shell.

8. A specimen holder according to claim 7, wherein the openings (9) of the shell-shaped connecting element (8) are such that the heat conduction is at least less than one tenth of a comparable structure without openings, preferably less than one hundredth.

9. A specimen holder according to claim 7, wherein the shell-shaped connecting element (8) is manufactured from titanium.

10. A specimen holder according to claim 1, in which the first and/or the second temperature control means comprise a temperature sensor.

11. A specimen holder according to claim 10, wherein the temperature sensor comprises a thermo couple (11).

12. A specimen holder according to claim 1, wherein the tip (3) comprises a frame (20) and a platform (24), provided with a recess (25) to receive the specimen, which platform (24) is suspended by means of a subframe (22) so as to be tiltable in the frame (20), which frame (20) and subframe (22) are manufactured from two different materials having a different expansion coefficient and are dimensioned and positioned relative to each other such that expansion or shrinkage of the frame and the subframe outweigh each other as a result of temperature changes occurring in the tip (3) during use, such that a specimen placed on the platform (24) during use is substantially not displaced.

13. A specimen holder according to claim 12, wherein the frame (20) is manufactured from tungsten and the subframe (22) from aluminum.

14. A specimen holder according to claim 1, wherein the rod-shaped part (2) is manufactured from a material which has a relatively good heat conduction and a relatively low thermal expansion coefficient and is preferably not magnetic.

15. An assembly of an electron microscope and a specimen holder (1), wherein the electron microscope is provided with clamping means (5) for holding the specimen holder (1) in the electron microscope, which electron microscope comprises third temperature control means to keep the clamping means (5) at a desired temperature and the specimen holder (1) comprises first temperature control means (10) to keep at least a part of the specimen holder (1) being in contact with these clamping means (5) substantially at the same temperature as the clamping means (5).

16. A method for reducing thermal drift in an electron microscope, comprising the following steps:
    placing a specimen on the specimen holder (1);
    fixing the specimen holder (1) in the electron microscope in clamping means (5) suitably provided in the electron microscope;
    adapting the temperature of the specimen holder (1) and/or the clamping means (5), so that both obtain and keep substantially the same temperature.

* * * * *